United States Patent
Daido et al.

(10) Patent No.: US 11,264,534 B2
(45) Date of Patent: Mar. 1, 2022

(54) METHOD FOR MANUFACTURING PACKAGE LID MEMBER AND METHOD FOR MANUFACTURING PACKAGE

(71) Applicant: MITSUBISHI MATERIALS CORPORATION, Tokyo (JP)

(72) Inventors: Satoru Daido, Sanda (JP); Hironori Uno, Sanda (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 0 days.

(21) Appl. No.: 17/275,816

(22) PCT Filed: Oct. 24, 2019

(86) PCT No.: PCT/JP2019/041664
§ 371 (c)(1),
(2) Date: Mar. 12, 2021

(87) PCT Pub. No.: WO2020/090610
PCT Pub. Date: May 7, 2020

(65) Prior Publication Data
US 2021/0249559 A1    Aug. 12, 2021

(30) Foreign Application Priority Data

Oct. 29, 2018 (JP) .............................. JP2018-203063
Oct. 17, 2019 (JP) .............................. JP2019-190241

(51) Int. Cl.
*H01L 33/00* (2010.01)
*H01L 33/48* (2010.01)
(Continued)

(52) U.S. Cl.
CPC ........ *H01L 33/0095* (2013.01); *H01L 33/486* (2013.01); *H01L 2933/0033* (2013.01)

(58) Field of Classification Search
CPC ............................... H01L 23/02; H01L 23/08
See application file for complete search history.

(56) References Cited

U.S. PATENT DOCUMENTS

| 2003/0034381 A1 | 2/2003 | Nakatsuka et al. |
| 2016/0049381 A1 | 2/2016 | Ryu et al. |
| 2016/0254209 A1 | 9/2016 | Oohiraki et al. |

FOREIGN PATENT DOCUMENTS

| CN | 1498195 A | 5/2004 |
| CN | 1784288 A | 6/2006 |

(Continued)

OTHER PUBLICATIONS

Notice of Allowance dated Apr. 23, 2021, issued for Korean Patent Application No. 10-2020-7034720 and English translation thereof.
(Continued)

*Primary Examiner* — Marcos D. Pizarro
*Assistant Examiner* — Antonio B Crite
(74) *Attorney, Agent, or Firm* — Locke Lord LLP

(57) ABSTRACT

A method for manufacturing a package lid member includes a metalizing step of forming a metalized layer on a surface of a glass member, a paste applying step of applying an Au—Sn paste on the metalized layer in a frame shape, a reflow step of heating the glass member to which the Au—Sn paste was applied after the paste applying step and reflowing the Au—Sn paste, and a cooling step of cooling the glass member after the reflow step to form an Au—Sn layer. The cooling step includes a holding step of holding the glass member in a temperature range of 150° C. or higher and 190° C. or lower for 2 minutes or longer.

11 Claims, 6 Drawing Sheets

(51) Int. Cl.
*H01S 5/00* (2006.01)
*H01L 23/02* (2006.01)
*H01L 23/08* (2006.01)
*H01L 23/10* (2006.01)
*H01L 23/13* (2006.01)
*H01S 5/022* (2021.01)

(56) References Cited

FOREIGN PATENT DOCUMENTS

| CN | 102785039 | A | | 11/2012 | | |
|----|-----------|---|---|---------|---|---|
| CN | 103119737 | A | | 5/2013 | | |
| CN | 108608137 | A | | 10/2018 | | |
| JP | 2008-258353 | A | | 10/2008 | | |
| JP | 2011-040577 | A | | 2/2011 | | |
| JP | 2015-122413 | A | | 7/2015 | | |
| JP | 2016-219505 | A | | 12/2016 | | |
| JP | 6260919 | B2 | | 1/2018 | | |
| JP | 2018-037581 | A | | 3/2018 | | |
| JP | 6294417 | B2 | | 3/2018 | | |
| JP | 2018037581 | A | * | 3/2018 | ........... | H01L 33/486 |
| JP | 2018-152385 | A | | 9/2018 | | |

OTHER PUBLICATIONS

International Search Report dated Jan. 7, 2020, issued for PCT/JP2019/041664 and English translation thereof.
Office Action dated Jun. 18, 2021, issued for Chinese Patent Application No. 201980059185.4 and English translation of the Search Report.

* cited by examiner ical field

The present invention relates to a method for manufacturing a package lid member to be bonded to a package substrate and a method for manufacturing a package.

This application claims priority based on Japanese Patent Application No. 2018-203063 filed in Japan on Oct. 29, 2018 and Japanese Patent Application No. 2019-190241 filed in Japan on Oct. 17, 2019, and the contents thereof are incorporated therein.

BACKGROUND ART

In the related art, semiconductor devices and light emitting devices in which a light emitting element is sealed in a package in order to protect light emitting elements such as semiconductor lasers (LDs) and LEDs from the external environment are known (refer to, for example, Patent Literature 1 and 2).

In the semiconductor device described in Patent Literature 1, a package substrate having a recess which opens to an upper end, an optical semiconductor element accommodated in the recess, a window member (package lid member) formed of a material such as glass which transmits light and arranged so as to cover the opening of the recess, and a sealing structure which seals between the package substrate and the window member are provided. This sealing structure is formed to have a first metal layer provided in a frame shape on the upper surface of the package substrate, a second metal layer provided in a frame shape on the inner surface of the window member, and a metal bonding portion provided between the first metal layer and the second metal layer, in which, in the region in which one of the first metal layer and the second metal layer is provided, the entirety of the other of the first metal layer and the second metal layer is positioned therein.

The light emitting device described in Patent Literature 2 is provided with a mounting substrate, an ultraviolet light emitting element mounted on the mounting substrate, and a cap (package lid member) arranged on the mounting substrate and in which a recess which accommodates the ultraviolet light emitting element is formed. The mounting substrate is provided with a support, a first conductor portion, a second conductor portion, and a first bonding metal layer, which are supported by the support. The cap is provided with a cap body formed of glass or the like in which a recess is formed on the back surface, and a second bonding metal layer arranged at the peripheral portion of the recess so as to oppose the first bonding metal layer. The uppermost layer, which is the farthest from the support, in each of the first conductor portion, the second conductor portion, and the first bonding metal layer is formed of Au, and the first bonding metal layer and the second bonding metal layer are bonded by Au—Sn.

CITATION LIST

Patent Literature

Patent Literature 1

Japanese Patent No. 6294417

Patent Literature 2

Japanese Patent No. 6260919

SUMMARY OF INVENTION

Technical Problem

The metal bonding portion described in Patent Literature 1 is formed of an Au—Sn alloy. Also, in Patent Literature 2, the first bonding metal layer and the second bonding metal layer are bonded by an Au—Sn alloy. That is, in all of the configurations of Patent Literature 1 and 2, an Au—Sn layer formed of an Au—Sn alloy is formed on the package lid member made of glass. The Au—Sn layer is formed, for example, by applying and reflowing Au—Sn paste on the part described above.

However, when the Au—Sn paste is applied and reflowed on a glass plate material, due to the difference in shrinkage ratio at the time of cooling, the Au—Sn layer may peel off from the glass plate material or a part of the glass plate material may peel off, and there is a concern that the package lid member may be damaged. Furthermore, there is a concern that the glass plate material (lid material) bonded to the substrate by the Au—Sn layer may fall off from the substrate.

The present invention was made in view of such circumstances and has an object of providing methods for manufacturing a package lid member and a package, capable of suppressing peeling off of and damage to an Au—Sn layer.

Solution to Problem

A method for manufacturing a package lid member of one aspect of the present invention includes a metalizing step of forming a metalized layer at a bonding portion provided on a surface of a glass member, a paste applying step of applying an Au—Sn paste on the metalized layer to form a paste layer, a reflow step of heating and reflowing the Au—Sn paste applied to the glass member after the paste applying step, and a cooling step of cooling the reflowed Au—Sn paste. The cooling step includes a holding step of holding the reflowed Au—Sn paste in a temperature range of 150° C. or higher and 190° C. or lower for a holding time of 2 minutes or longer, and an Au—Sn layer formed of an Au—Sn alloy obtained by melting and solidifying the Au—Sn paste is formed at the bonding portion of the glass member. The bonding portion may have a planar frame shape, and the metalized layer and the Au—Sn paste layer may be formed in a planar frame shape along the bonding portion. A plurality of the metalized layers and the Au—Sn paste layers may be formed on the surface of the glass member. In such a case, it is possible to obtain a plurality of package lid members by finally dividing the glass member.

In the present specification, the Au—Sn paste applied to the glass member is referred to as an "Au—Sn paste (layer)" after being melted by the reflow step and until solidified by the cooling step, and as an "Au—Sn layer" after being solidified by the cooling step.

In a case where the Au—Sn paste is applied to a glass member via a metalized layer, reflowed, and then cooled at a general cooling rate (for example, a cooling rate of about 3° C./sec), the difference between the coefficient of linear expansion of the Au—Sn alloy melted by the reflowing and the coefficient of linear expansion of the glass member is comparatively large. That is, since the shrinkage ratio of the Au—Sn alloy due to the cooling is larger than the shrinkage ratio of the glass member, the Au—Sn layer may be peeled off from the glass member or a part of the glass member may be peeled off.

On the other hand, in the method of the present aspect, in the cooling step after reflowing the Au—Sn paste, the reflowed Au—Sn paste is held in the temperature range of 150° C. or higher and 190° C. or lower for 2 minutes or longer, thus, at least a part of a ξ phase (zeta phase) in which Au:Sn=5:1 (atomic ratio) in the Au—Sn layer is changed to a stable ξ' phase (zeta prime phase) in which Au:Sn=1:1 (atomic ratio), and, due to this, the Au—Sn layer is softer than in a case of the ξ phase alone. Even if the Au—Sn layer is cooled at a normal cooling rate (for example, a cooling rate of 3° C./sec) after the holding step, the ξ' phase is maintained, thus, it is possible to suppress the difference between the coefficient of linear expansion of the Au—Sn alloy during the solidification process and the coefficient of linear expansion of the glass member to be relatively small, and to suppress peeling off of the Au—Sn layer from the glass member or peeling off of a part of the glass member.

In the method for manufacturing a package lid member according to the present aspect, the holding temperature in the holding step is preferably 160° C. or higher and 180° C. or lower, and the holding time in the holding step is preferably 3 minutes or longer and 8 minutes or shorter.

In the method for manufacturing a package lid member according to the present aspect, a heating temperature in the reflow step is preferably 280° C. to 350° C., and a heating time is preferably 10 seconds to 120 seconds.

The heating temperature is more preferably 330° C. or lower, and even more preferably 300° C. or lower. The heating time is more preferably 20 to 90 seconds, and even more preferably 30 to 60 seconds.

In the method for manufacturing a package lid member according to the present aspect, preferably, the metalized layer is formed in a plurality of frame shapes on the glass member in the metalizing step and the Au—Sn paste is applied onto each of the plurality of metalized layers in the paste applying step, and a dividing step of dividing the glass member, in which Au—Sn layers are formed in a plurality of frame shapes, into each Au—Sn layer, is performed after the cooling step.

The method for manufacturing a package according to one aspect of the present invention is a method for manufacturing a package by bonding a package lid member obtained by any of the above manufacturing methods and a package substrate, the method including an arranging step of arranging the package lid member and the package substrate such that the Au—Sn layer is in contact with the package substrate, a heating step of heating the package substrate and the package lid member to melt the Au—Sn layer, and a cooling step of cooling the melted Au—Sn layer to form a bonding layer for bonding the package substrate and the package lid member, in which the cooling step includes a holding step of holding the melted Au—Sn layer in a temperature range of 150° C. or higher and 190° C. or lower for a holding time of 2 minutes or longer.

When bonding the package substrate and the package lid member, the heated and melted Au—Sn layer is held in the temperature range of 150° C. or higher and 190° C. or lower for 2 minutes or longer in the step of cooling the heated and melted Au—Sn layer such that at least a part of the bonding layer obtained by solidifying the Au—Sn layer changes to the ξ' phase, which is softer than the phase of Au—Sn. Accordingly, in the package obtained by bonding the package substrate and the package lid member, it is possible to alleviate stress at the bonding portion and to prevent damage to the glass member, peeling off of the bonding layer, and falling off of the lid material.

In the method for manufacturing a package, preferably, the heating temperature and the heating time in the heating step are approximately equal to the heating temperature and the holding time in the reflow step of the method for manufacturing a package lid member. That is, the heating temperature in the heating step is preferably 280° C. to 350° C. and the heating time is preferably 10 seconds to 120 seconds. The heating temperature is more preferably 330° C. or lower, and even more preferably 300° C. or lower. The heating time is more preferably 20 to 90 seconds, and even more preferably 30 to 60 seconds.

Advantageous Effects of Invention

According to the method for manufacturing a package lid member and the method for manufacturing a package of the present invention, it is possible to provide a package lid member and a package capable of suppressing peeling off of and damage to an Au—Sn layer.

DESCRIPTION OF EMBODIMENTS

Figure 1:
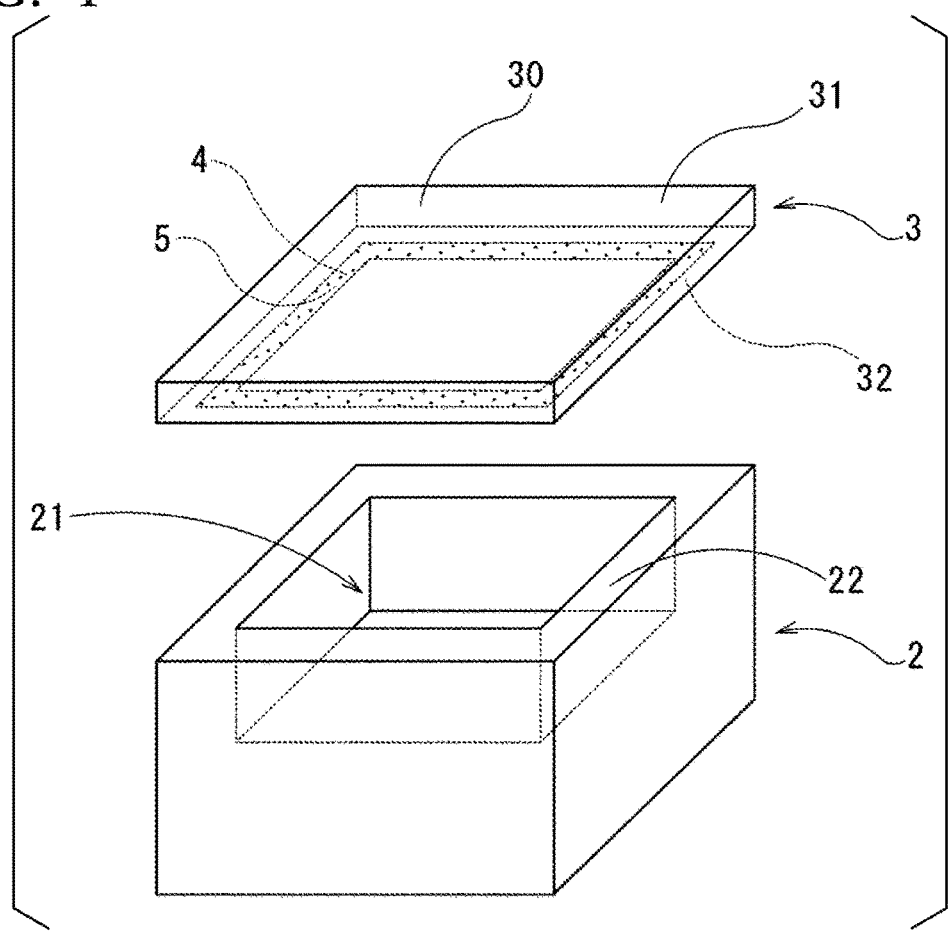
FIG. 1 is a perspective view showing a package lid member and a package substrate obtained by the method for manufacturing a package lid member according to an embodiment of the present invention.
Figure 2:
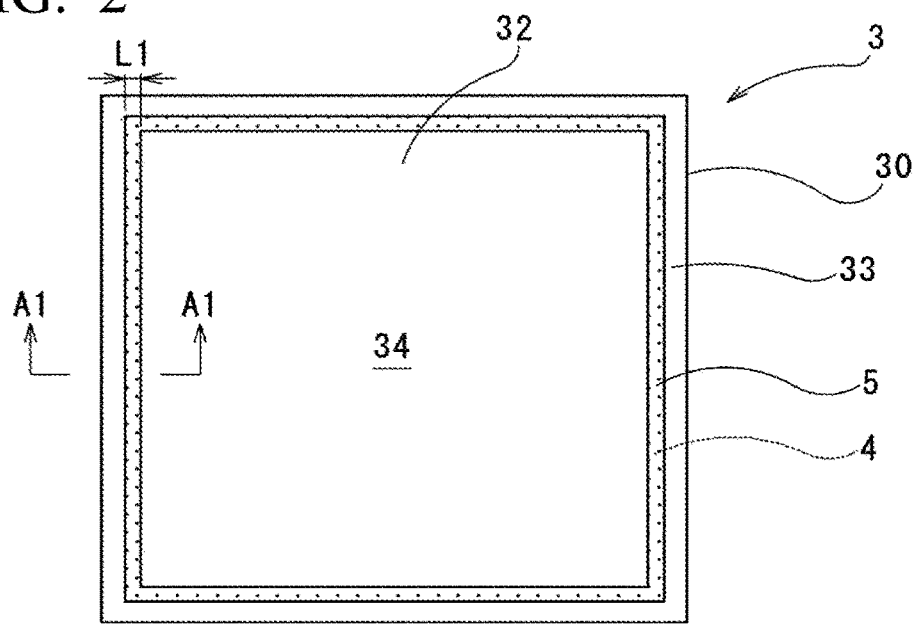
FIG. 2 is a bottom surface view of the package lid member in the present embodiment.
Figure 3:
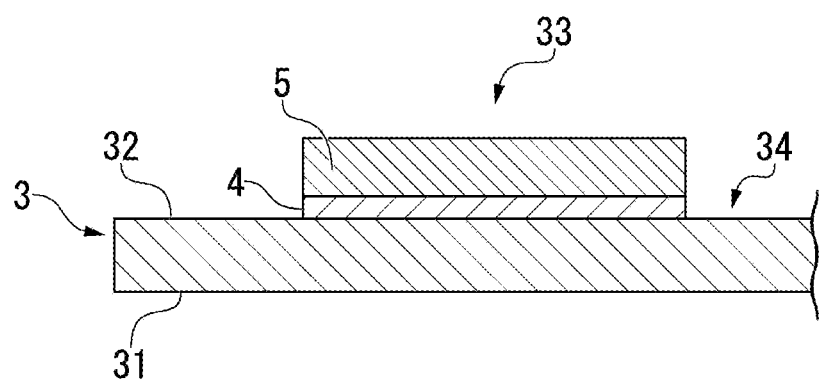
FIG. 3 is a cross-sectional view of the package lid member taken along an A1-A1 arrow line shown in FIG. 2.
Figure 5:
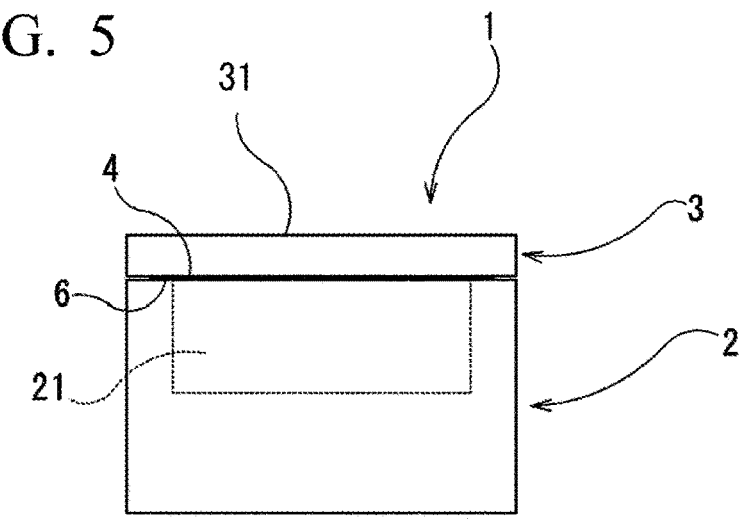
FIG. 5 is a front view showing a package according to the present embodiment.

A description will be given below of embodiments of a method for manufacturing a package lid member and a method for manufacturing a package according to the present invention, using drawings. FIG. 1 is a perspective view showing a package substrate 2 and a package lid member 3 forming a package 1 obtained in the present embodiment. FIG. 2 is a bottom surface view of the package lid member 3. FIG. 3 is a cross-sectional view of the package lid member 3 taken along an A1-A1 arrow line of FIG. 2. FIG. 5 is a side surface view showing the package 1 according to the present embodiment.

[Outline Structure of Package]

As shown in FIG. 1 and FIG. 5, the package 1 is provided with the package substrate 2 having a recess 21, which opens at an upper portion, and a flat plate-shaped package lid member 3, which is bonded to the package substrate 2 to close the recess 21. The package substrate 2 of this example has a rectangular parallelepiped shape and a rectangular parallelepiped recess 21 is formed approximately in the center of the upper surface thereof. The package lid member 3 in this example has the same rectangular shape as the upper surface of the package substrate 2 in a plan view and has a plate shape with a constant thickness. However, the package which is the subject of the embodiment of the present invention is not limited to the shape described above or to a rectangular parallelepiped shape as long as the package has a structure in which the recess forming surface of the package substrate having the recess is sealed by the package lid member, and it is possible to apply the package to any shape such as another polygonal columnar shape, a cylindrical shape, an elliptical columnar shape, and a spherical shape. A light emitting element such as a laser diode (LD), a light emitting diode (LED) (not shown), or the like is accommodated in the package 1.

[Package Substrate Configuration]

As shown in FIG. 1, the package substrate 2 has a bonding surface 22 provided on the periphery of the recess 21 and, for example, is formed in a rectangular box shape using aluminum nitride (AlN) or the like. The recess 21 is airtightly closed by bonding the outer periphery of the bottom surface of package lid member 3 to the bonding surface 22 and forms a space for accommodating a light emitting element or the like. The bonding surface 22 in this example is a flat surface, but the bonding surface is not limited to a flat surface and may be a three-dimensional shape having irregularities or inclined surfaces which fit each other, or have complementary curved surfaces which abut each other in an airtight manner. In addition, there may be a recess or a projection on the back surface of the package lid member 3 corresponding to the recess 21.

[Configuration of Package Lid Member]

As shown in FIG. 1 to FIG. 3, the package lid member 3 is formed of a rectangular plate-shaped glass member 30 having a bonding portion 33 provided in a planar frame shape (square shape) and a light transmitting portion 34 provided inside the bonding portion 33, a metalized layer 4 formed in a frame shape (square shape) along the bonding portion 33, and an Au—Sn layer 5 formed in a frame shape (square shape) on the metalized layer 4.

The glass member 30 has an upper surface 31 which is the top surface of the package 1 and a lower surface 32 including the bonding portion 33 which is bonded to the bonding surface 22 of the package substrate 2 and, for example, is formed in the shape of a rectangular plate having sides of 2 mm to 30 mm and a thickness of 50 μm to 3000 μm using glass such as borosilicate glass, or quartz glass, without being limited thereto.

As shown in FIG. 2 and FIG. 3, in the bonding portion 33, the rectangular frame-shaped metalized layer 4 formed of Au, Ti, Ni, or the like is formed in a square shape larger than the flat surface of the recess 21 of the package substrate 2 so as to surround the recess 21.

As shown in FIG. 2 and FIG. 3, the Au—Sn layer 5 having the same rectangular frame shape as the metalized layer 4 is formed on the metalized layer 4. A width L1 of the Au—Sn layer 5 is the same as the width of the metalized layer 4 or narrower than the width of the metalized layer 4 and is set to 50 μm or more and 1000 μm or less. Due to this, the entire surface or a part of the metalized layer 4 is covered with the Au—Sn layer 5. The Au—Sn layer 5 does not need to protrude outside the metalized layer 4, but a part of the Au—Sn layer 5 in the width direction is allowed to slightly protrude outside the metalized layer 4 in the present embodiment.

A light emitting element is accommodated in the recess 21 of the package substrate 2 described above and then the Au—Sn layer 5 on the lower surface 32 of the package lid member 3 is made to abut on the bonding surface 22 of the package substrate 2 so as to carry out reflowing on (heat) the package substrate 2 and the package lid member 3 and, due to this, the package substrate 2 and the package lid member 3 are bonded by a bonding layer 6 (Au—Sn solder) formed by melting and solidifying the Au—Sn layer 5, and the package 1 is formed, as shown in FIG. 5.

[Method for Manufacturing a Package Lid Member]

The method for manufacturing the package lid member 3 is provided with a metalizing step of forming the metalized layer 4 in a frame shape on the surface (bonding portion 33) of the glass member 30, a paste applying step of applying an Au—Sn paste in a frame shape on the metalized layer 4, a reflow step of heating the glass member 30 applied with the Au—Sn paste to reflow the Au—Sn paste after the paste applying step, a cooling step of cooling the glass member 30 after the reflow step, and a dividing step of dividing the glass member 30 after the cooling step.

(Metalizing Step)

Figure 6:
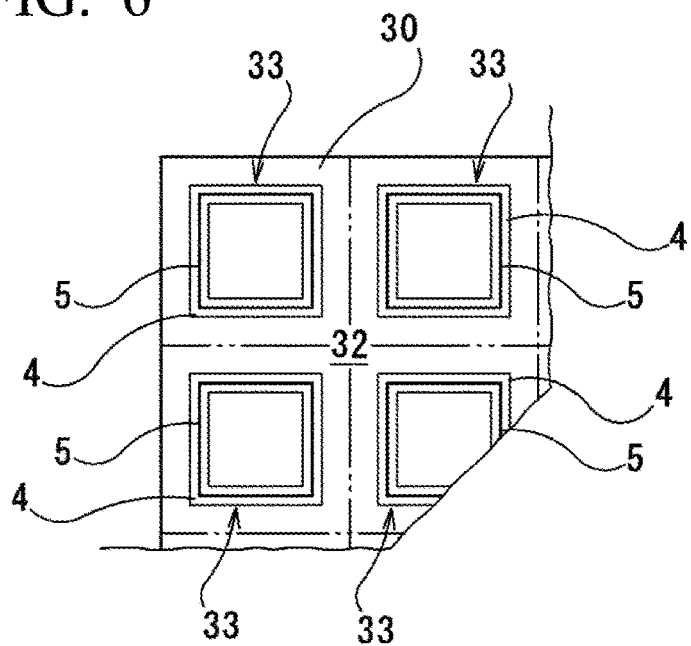
FIG. 6 is a plan view showing a glass member in a metalizing step and a paste applying step according to the manufacturing method of the present embodiment.

As shown in FIG. 6, the metalized layer 4 is formed by a sputtering method using Au, Ti, Ni or the like, various plating methods such as electroless plating, or the like, on the plurality of planar frame-shaped bonding portions 33 arranged in a grid pattern on the surface (the lower surface 32 of the package lid member 3) of the glass member 30 (for example, 20 mm×20 mm in size and 0.5 mm in thickness). The metalized layer 4 is preferably formed by Au plating. The metalized layer 4 and the Au—Sn layer 5 formed on the metalized layer 4 are formed in the same number of rectangular frame shapes (for example, squares having a length and width of 3 mm and a width of 500 μm) having the same planar shape as each other.

(Paste Applying Step)

An Au—Sn paste is applied on the metalized layers 4 so as to form a plurality of rectangular frames (for example, squares having a length and width of 3 mm) having the same shape as the metalized layers 4. The Au—Sn paste is, for example, obtained by mixing an Au—Sn alloy powder in which Sn is 21% by mass or more and 23% by mass or less and the remainder is Au and inevitable impurities, and a flux such that the ratio of the flux is 5% by mass or more and 20% by mass or less when the Au—Sn paste is 100% by mass.

As the flux, for example, it is possible to use an RA type (strong activation flux) in the MIL standard, an RMA type (weak activation flux), a non-halogen type flux, an MSN type, an AS1 type, an AS2 type, and the like.

Preferably, the Au—Sn paste is printed and applied on the metalized layer 4 so as to form a rectangular frame having a width of 50 μm or more and 1000 μm or less and a thickness of 1 μm or more and 100 μm or less. The Au—Sn paste may be applied by being discharged and supplied with a dispenser or the like or may be applied by a printing method such as transfer printing or screen printing. In addition, the width of the Au—Sn paste is not limited to the same width as the metalized layer 4 and may be narrower than the width of the metalized layer 4, and, although not preferable, bonding is possible even when slightly wider than the metalized layer 4 and protruding from the metalized layer 4.

(Reflow Step)

Next, the Au—Sn paste printed and applied to the glass member 30 is heated to melt (reflow) the Au—Sn paste. This reflow step is performed in a non-oxidizing atmosphere such as an $N_2$ atmosphere. During the reflowing, the glass member 30 and the Au—Sn paste are preferably kept horizontal such that the melted Au—Sn alloy does not flow. Due to this, the Au—Sn paste is melted, the Au—Sn alloy in a melted state remains on the metalized layer 4 without flowing, and this state is maintained. In order to prevent flowing, the bonding surface is preferably a flat surface so as to be able to be kept horizontal over the entire surface, but even in a case where the bonding surface has a slight inclination, the flowing is impeded to a certain extent due to the viscosity of the melted Au—Sn alloy and the wettability to the metalized layer 4.

The heating temperature in the reflow step may be in a range of 280° C. to 350° C., preferably in a range of 280° C. to 330° C., and more preferably in a range of 280° C. to 300° C. The heating time may be maintained in a range of 10 seconds to 120 seconds in this heating temperature range, preferably in a range of 20 seconds to 90 seconds, and more preferably in a range of 30 seconds to 60 seconds. An example of a suitable condition is a condition of heating at 300° C. for 60 seconds.

(Cooling Step)

After melting the Au—Sn paste by the reflow step, the melted Au—Sn alloy and the glass member 30 are cooled to form the solidified Au—Sn layer 5 as shown in FIG. 3. In the cooling step, a holding step of holding the Au—Sn paste and the glass member 30 in a constant temperature range during the cooling is provided. In the holding step, the holding temperature of the Au—Sn paste is set in the range of 150° C. or higher and 190° C. or lower, and the holding time within the temperature range is set to 2 minutes or longer. By performing the holding step, at least a part of the ξ phase ($Au_5Sn$) in which Au:Sn=5:1 (atomic ratio) in the Au—Sn alloy is changed to the more stable ξ' phase (AuSn) in which Au:Sn=1:1 (atomic ratio) and the Au—Sn layer 5 is softened compared with the case of only the ξ phase.

In this manner, the Au—Sn layer 5 is formed on the glass member 30 via the metalized layer 4. The formed Au—Sn layer 5 is an Au—Sn alloy in which Sn is 19 wt % to 23 wt % and the remainder is Au.

Here, the Au—Sn paste applied to the glass member 30 is called an "Au—Sn paste" after being melted by the reflow step and until solidified by the cooling step, and an "Au—Sn layer" after being solidified by the cooling step.

In a case where the holding temperature in the holding step is less than 150° C., the change from the ξ phase to the ξ' phase is slow, while the change from the ξ phase to the ξ' phase does not occur when held at a temperature exceeding 190° C., thus, even if the holding time condition is satisfied, there is a concern that it may not be possible to suppress peeling or damage. The holding temperature is more preferably in the range of 160° C. or higher and 180° C. or lower.

When the holding time in the holding step is less than 2 minutes, even if the holding temperature condition is satisfied, there is a concern that the change from the ξ phase to the ξ' phase may not proceed sufficiently and it may not be possible to suppress peeling or damage. The upper limit of the holding time is not particularly limited, but is preferably set to 10 minutes or shorter because it is difficult to further improve the characteristics even if the holding time is longer than 10 minutes. More preferably, the holding time is in the range of 3 minutes or longer and 8 minutes or shorter.

In the holding step, the temperature does not necessarily have to be constant and there is no problem even if the temperature changes in a range of 150° C. or higher and 190° C. or lower. The cooling rate from the maximum temperature during heating to 190° C. is not particularly limited and may be, for example, 0.5° C./sec to 5° C./sec, and, from the viewpoint of ease of processing and the like, more preferably 2° C./sec to 4° C./sec. For example, it is possible to carry out the cooling at a normal cooling rate of 3° C./sec.

Figure 4:
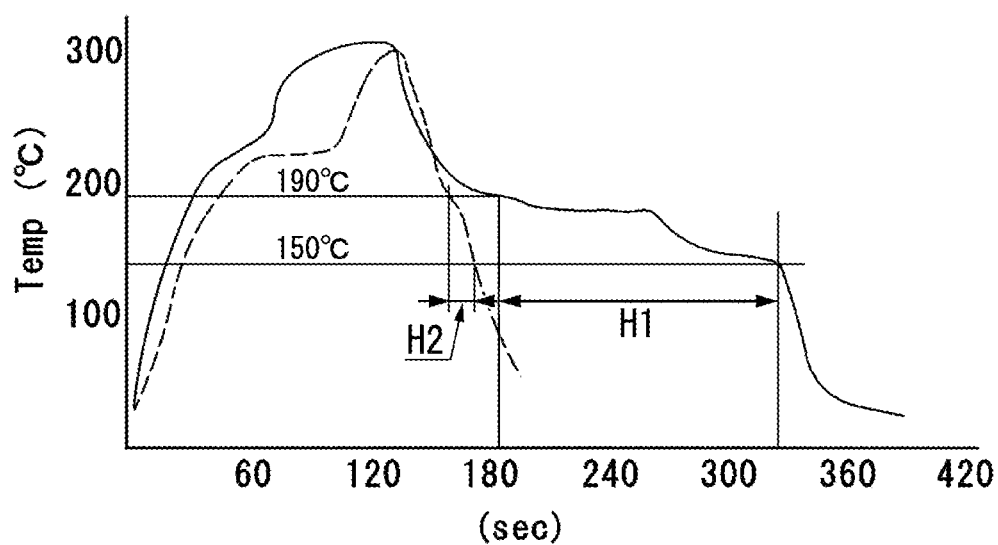
FIG. 4 is a view showing temperature changes during reflowing and cooling after an Au—Sn paste is applied to the package lid member of an Example of the present embodiment.

FIG. 4 shows the temperature changes in the reflow step and cooling step in an Example of the present embodiment. In FIG. 4, the solid line is the temperature change of an Example of the present embodiment and cooling is carried out for a time H1 of 2 minutes or longer in the temperature range of 150° C. or higher and 190° C. or lower. On the other hand, the broken line in FIG. 4 is the temperature change in the heat treatment in a Comparative Example, and cooling is carried out for a time H2 shorter than 2 minutes in a temperature range of 150° C. or higher and 190° C. or lower.

As shown in the time H1 of FIG. 4, in the present embodiment, after the temperature of the Au—Sn alloy (and the glass member 30) decreases to 190° C. in the cooling step after the reflow step, the temperature is held in a range of 150° C. or higher and 190° C. or lower for 2.3 minutes (holding step). On the other hand, in the related art, cooling is performed at an approximately constant rate after the reflow step, and a holding step is not provided.

After applying the Au—Sn paste to the glass member 30 via the metalized layer 4 and carrying out reflowing, when cooled at the cooling rate of the Comparative Example (for example, a cooling rate of approximately 3° C./sec) as shown by the broken line in FIG. 4, the coefficient of linear expansion of the Au—Sn alloy obtained by melting through the reflowing and the coefficient of linear expansion of the glass member 30 are different, that is, the shrinkage ratio of the Au—Sn alloy due to cooling is larger than the shrinkage ratio of the glass member 30, thus, the Au—Sn layer 5 may be peeled off from the glass member 30 or a part of the package lid member 3 may be peeled off.

In the present embodiment, in the cooling step after heating and reflowing the Au—Sn paste applied to the glass member 30 via the metalized layer 4, the Au—Sn paste is held in a temperature range of 150° C. or higher and 190° C. or lower for 2 minutes or longer, thus, the ξ phase in the Au—Sn layer 5 changes to a stable ξ' phase and is softened compared with a case where the Au—Sn layer 5 is cooled at a normal cooling rate to generate the ξ phase. For this reason, the stress generated in the Au—Sn layer 5 is alleviated, and even if the Au—Sn layer 5 is cooled by a normal cooling rate (for example, a cooling rate of 3° C./sec) after the holding step, it is possible to suppress the Au—Sn layer 5 from peeling off from the glass member 30 or a part of the glass member 30 from being peeled off, and to prevent damage to the glass member 30.

(Dividing Step)

By dividing the glass member 30, on which a plurality of frame-shaped Au—Sn layers 5 are formed, at each Au—Sn layer 5 (refer to FIG. 6), the package lid member 3 shown in FIGS. 2 and 3 is manufactured.

[Method for Manufacturing Package]

The package 1 is formed by bonding the package lid member 3 and the package substrate 2 by performing the following steps.

(Arranging Step)

As shown in FIG. 1, the package lid member 3 and the package substrate 2 are arranged by being superimposed and the Au—Sn layer 5 is brought into contact with the package substrate 2.

(Heating Step)

The package substrate 2 and the package lid member 3 are heated in the same temperature range (280° C. to 350° C.) and heating time (10 seconds to 120 seconds) as in the reflow step in the method for manufacturing the package lid member 3 described above and the Au—Sn layer 5 is melted again. At this time, the package substrate 2 and the package lid member 3 are pressed in the laminating direction as necessary.

(Cooling Step)

In the same manner as the cooling step in the method for manufacturing the package lid member 3 described above, the package substrate 2 and the package lid member 3 are cooled while performing the holding step (150° C. or higher and 190° C. or lower, 2 minutes or longer), the melted Au—Sn layer 5 is solidified to form the bonding layer 6, and the package substrate 2 and the package lid member 3 are bonded (FIG. 5).

(Holding Step)

Also in the cooling step in the method for manufacturing the package 1, the holding step of holding the melted Au—Sn layer 5 in the temperature range of 150° C. or higher and 190° C. or lower for 2 minutes or longer is performed in the same manner as the method for manufacturing the package lid member 3 and a soft ξ' phase (zeta prime phase) is obtained.

In the same manner as the manufacturing step of the package lid member 3, also when manufacturing the package 1, the remelted Au—Sn layer 5 is held in the cooling step in a temperature range of 150° C. or higher and 190° C. or lower for 2 minutes or longer, thus, at least a part of the ξ phase in the Au—Sn layer 5 changes to the stable ξ' phase. Due to this, the Au—Sn layer 5 becomes soft, thus, even if the Au—Sn layer 5 is cooled at a normal cooling rate (for example, a cooling rate of 3° C./sec) after the holding step, the stress due to shrinkage during cooling is alleviated and it is possible to suppress peeling off of the Au—Sn layer 5 from the glass member or peeling off of a part of the glass member. That is, since the package substrate 2 and the package lid member 3 are bonded by the soft bonding layer 6, cracking of the glass member 30 in the package 1 and falling off of the package lid member 3 are prevented.

The present invention is not limited to the embodiment described above and it is possible to make various modifications thereto in a range which does not depart from the spirit of the present invention.

(Modification of Corner Portion of Au—Sn Layer)

Figure 7:
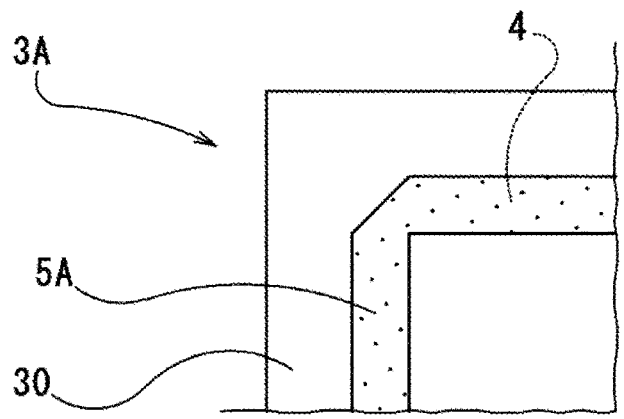
FIG. 7 is a plan view showing a modification of a corner portion of an Au—Sn layer.
Figure 8:
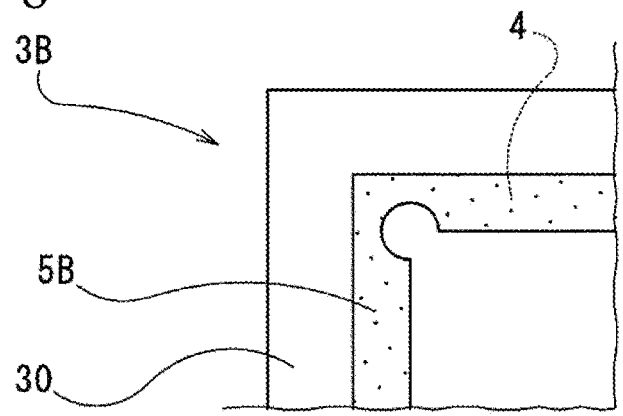
FIG. 8 is a plan view showing a modification of a corner portion of an Au—Sn layer.
Figure 9:
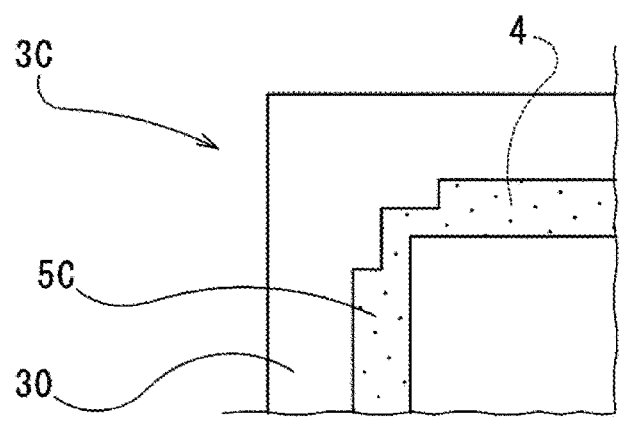
FIG. 9 is a plan view showing a modification of a corner portion of an Au—Sn layer.
Figure 11:
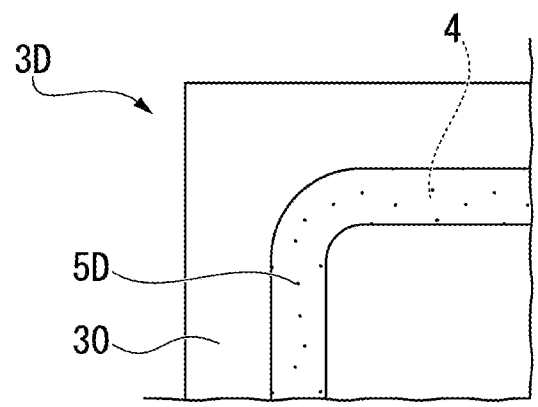
FIG. 11 is a plan view showing a modification of a corner portion of an Au—Sn layer.

When the width of the Au—Sn layer is large, peeling or cracking is likely to occur due to the difference in thermal expansion and contraction between the glass member 30 and the package substrate 2. Accordingly, the package lid member 3A (FIG. 7) in which the outer corners of the corner portions of the Au—Sn layer 5A are cut away diagonally, the package lid member 3B (FIG. 8) in which the inner corners of the corner portions of the Au—Sn layer 5B are cut away circularly, the package lid member 3C (FIG. 9) in which the width of the corner portions of the Au—Sn layer 5C is narrowed, the package lid member 3D in which the corner portions of the Au—Sn layer 5D have an arc shape and the width as a whole is equal (FIG. 11), and the like may be adopted. Chamfering the corner portions as described above makes it possible to suppress peeling and cracking.

Figure 10:
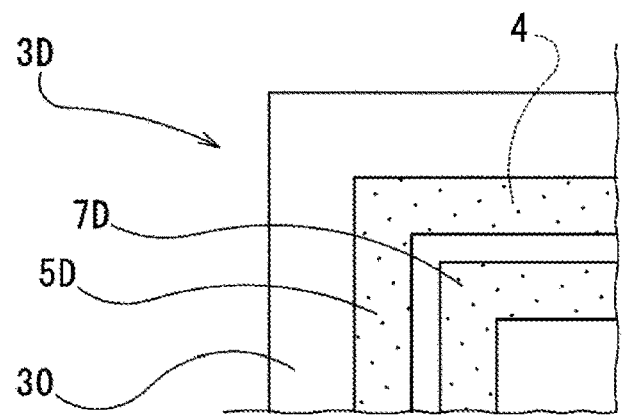
FIG. 10 is a plan view showing a modification of a corner portion of an Au—Sn layer.
Figure 12:
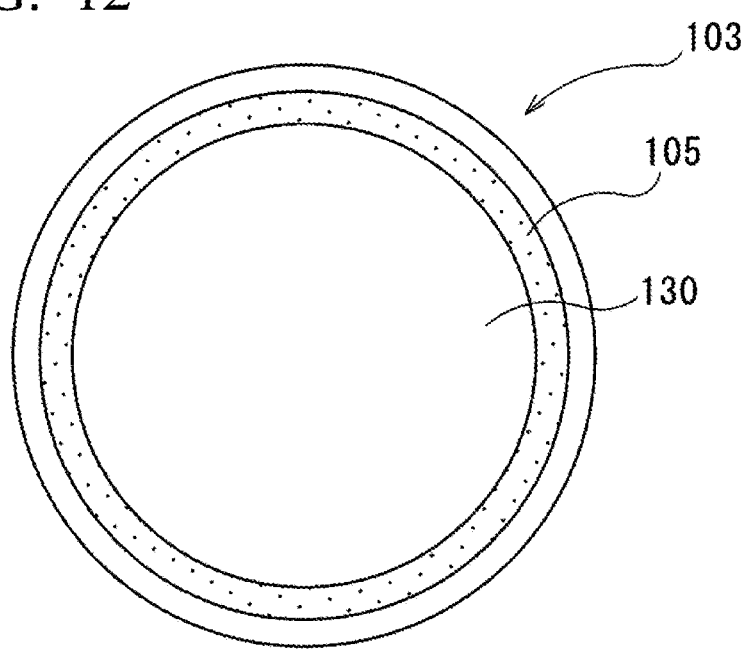
FIG. 12 is a plan view showing a modification of the glass member and the Au—Sn layer.

In addition, a package lid member 3D (FIG. 10) may be adopted in which Au—Sn layers 5D and 7D are provided as two layers and stress due to the difference in thermal expansion and contraction is dispersed. Alternatively, a package lid member 103 may be adopted in which a circular Au—Sn layer 105 is formed on the circular glass member 130 to prevent non-uniform stress due to the shape of the Au—Sn layer 105 (FIG. 12).

(Modification of Package Shape)

Figure 13:
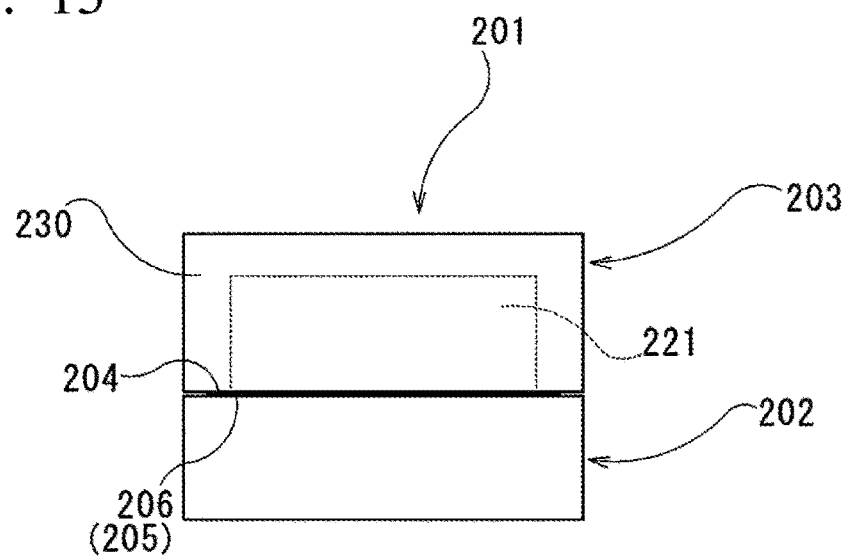
FIG. 13 is a side surface view showing a modification of the package shape.

As shown in FIG. 13, a package 201 may be configured by using a box-shaped package lid member 203 having a recess 221 and a flat plate-shaped package substrate 202. In this case, the package lid member 203 is manufactured in which, in a box-shaped glass member 230 having the recess 221, a metalized layer 204 and an Au—Sn layer 205 are formed in a frame shape on a frame-shaped flat surface (bonding portion) surrounding the recess 221 and it is possible to obtain the package 201 by bonding the package substrate 202 on which a light emitting element (not shown) is mounted and the package lid member 203 by a bonding layer 206 formed by melting and solidifying the Au—Sn layer 205 by performing each of the above steps.

EXAMPLES

Package lid members were manufactured by the methods of Examples 1 to 4 and Comparative Examples 1 to 4 in which only the holding steps were different, and the Au—Sn layers formed on each package lid member were compared. First, one glass member 10 having a size of 20 mm×20 mm×0.5 mm was prepared for each Example, and as shown in FIG. 14, the surface of each glass member 10 was plated with Au having a thickness of 0.1 μm and 25 square metalized layers 11 of 3.0 mm×3.0 mm×width 300 μm were formed at intervals of 3 mm in length and width (metalizing step).

An Au—Sn paste was applied onto each metalized layer 11 with the same shape and dimensions as the metalized layer 11 so as to cover the entire area of the metalized layer 11 (paste applying step). An Au-22% by mass Sn alloy powder having an average particle size of 7 μm was used as the Au—Sn paste and the ratio of the flux with respect to the entire paste was 10% by mass. An RA type was used as the flux.

In the paste applying step, the frame of the Au—Sn layer 12 having a package size of "3030" (3.0 mm×3.0 mm) was finally formed, thus, the Au—Sn paste was printed on the metalized layer 11 using a printing mesh mask with a thickness of 15 μm with 25 frame-shaped patterns having a width of 300 μm. Accordingly, the thickness of each formed paste layer was 15 μm.

Figure 14:
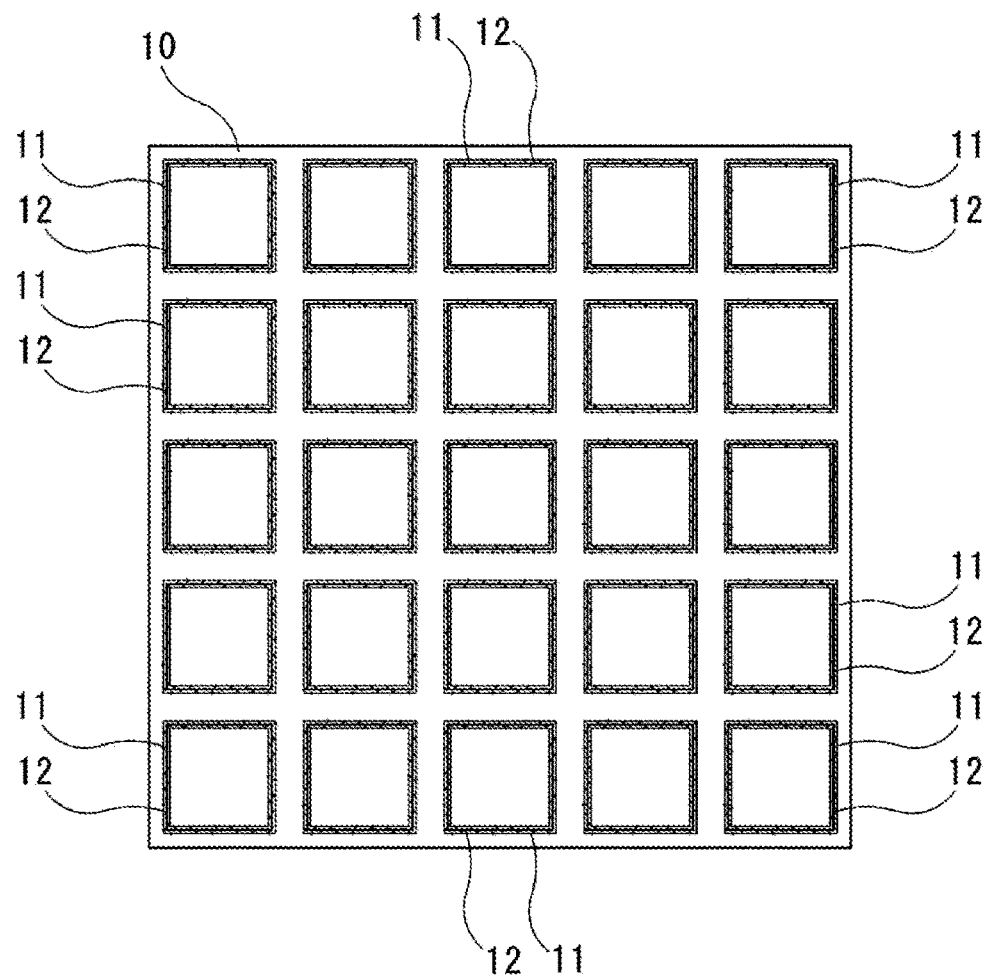
FIG. 14 is a plan view showing a state in which metalized layers and Au—Sn layers are formed in a plurality of frame shapes on a plate-shaped glass member, as Examples and Comparative Examples.

Then, the glass members 10 to which the Au—Sn paste was applied were individually subjected to reflowing using a heating furnace to form 25 Au—Sn layers 12 for each glass member 10 as shown in FIG. 14 (reflow step). In this reflow step, after heating at 300° C. for 1 minute in an $N_2$ atmosphere, the mixture was cooled to near room temperature in a heating furnace while maintaining the $N_2$ atmosphere (cooling step). In the cooling step, a holding step was performed in which the mixture was cooled at 3° C./sec until a predetermined holding temperature was reached and then held at a predetermined holding temperature for a predetermined holding time. The holding temperature and holding time were changed as shown in Table 1 so as to be Examples 1 to 4 and Comparative Examples 1 to 4. The cooling steps after the reflow step of Examples 1 to 4 and Comparative Examples 1 to 4 were as follows.

In the cooling step after the reflow step, all of Examples 1 to 4 were cooled at 3° C./sec and the holding temperatures and holding times in the holding step were different. That is, as shown in Table 1, Example 1 was cooled at 3° C./sec from 300° C. to 190° C., held at 190° C. for 5 minutes, and then cooled again at 3° C./sec. Example 2 was cooled at 3° C./sec from 300° C. to 150° C., held at 150° C. for 2 minutes, and then cooled again at 3° C./sec. Example 3 was cooled at 3° C./sec from 300° C. to 190° C., held at 190° C. for 2 minutes, and then cooled again at 3° C./sec. Example 4 was cooled at 3° C./sec from 300° C. to 160° C., held at 160° C. for 5 minutes, and then cooled again at 3° C./sec.

Comparative Example 1 was cooled at 3° C./sec from 300° C. to 130° C., held at 130° C. for 2 minutes, and then cooled again at 3° C./sec. Comparative Example 2 was cooled at 3° C./sec from 300° C. to 210° C., held at 210° C. for 2 minutes, and then cooled again at 3° C./sec. Comparative Example 3 was cooled at 3° C./sec from 300° C. to 160° C., held at 160° C. for 1 minute, and then cooled again at 3° C./sec. For Comparative Example 4, the cooling was continued at 3° C./sec from 300° C. and no holding step was provided.

When the thicknesses of the Au—Sn layers 12 of Examples 1 to 4 and Comparative Examples 1 to 4 formed as above were measured with an optical microscope, all were 4.7 μm. Further, for the 25 Au—Sn layers 12 obtained in each of Examples 1 to 4 and Comparative Examples 1 to 4, the internal/external penetration ratio of the Au—Sn layers 12 was measured as follows and the peeling of the Au—Sn layers 12 was evaluated.

(Evaluation of Internal/External Penetration Ratio of Au—Sn Layer)

The Au—Sn layer 12 formed on the metalized layer 11 of the glass member 10 was observed through the glass member 10 with an optical microscope (10 times) from the surface on which the Au—Sn layer was not formed, which was the upper surface of the package lid member, and it was examined whether or not there was a peeled portion continuously peeled from the outer peripheral edge to the inner peripheral edge of each Au—Sn layer 12. The Au—Sn layers 12 in which at least one peeled portion was generated were determined to be "unacceptable" and the Au—Sn layers 12 in which no peeled portion was present were determined to be "good". The ratio of the Au—Sn layers 12 determined to be "good" was calculated for each of the 25 Au—Sn layers 12 formed on the glass members 10 of Examples 1 to 4 and Comparative Examples 1 to 4.

TABLE 1

| | Holding Step | | |
|---|---|---|---|
| | Holding Temperature (° C.) | Holding Time (mm) | Evaluation of Internal/External Penetration Ratio of Au—Sn layer (%) |
| Example 1 | 190 | 5 | 72 |
| Example 2 | 150 | 2 | 48 |
| Example 3 | 190 | 2 | 48 |
| Example 4 | 160 | 5 | 60 |
| Comparative Example 1 | 130 | 2 | 32 |
| Comparative Example 2 | 210 | 2 | 36 |
| Comparative Example 3 | 160 | 1 | 32 |
| Comparative Example 4 | — | 0 | 28 |

In Examples 1 to 4 in which the cooling step including the holding step of holding at a temperature of 150° C. or higher and 190° C. or lower for 2 minutes or longer was executed, the evaluation of the internal/external penetration ratio of the Au—Sn layer 12 was 48% or more. Among these, in Examples 1 and 4 in which the holding step time was long (5 minutes), the evaluation of the internal/external penetration ratio of the Au—Sn layer 12 was 60% or more. Furthermore, in Example 1, since the holding temperature was as high as 190° C. as compared with Example 4, the evaluation of the internal/external penetration ratio of the Au—Sn layer 12 was 70%, which was the best evaluation among each of Examples 1 to 4.

On the other hand, in Comparative Example 1, since the temperature of the holding step was as low as 130° C., the evaluation of the internal/external penetration ratio of the Au—Sn layer was as low as 32%. In addition, in Comparative Example 2, since the temperature of the holding step was as high as 210° C., the evaluation of the internal/external penetration ratio of the Au—Sn layer was as low as 36%. In Comparative Example 3, the temperature of the holding step was 160° C., which was the same as that of Example 4, but the holding time was as short as 1 minute, thus, the evaluation of the internal/external penetration ratio of the Au—Sn layer was as low as 32%. In Comparative Example 4, since the cooling step did not include a holding step, the evaluation of the internal/external penetration ratio of the Au—Sn layer was 28%, which was the lowest evaluation among the Comparative Examples.

From the above, it was found that including the holding step of holding the glass member in the temperature range of 150° C. or higher and 190° C. or lower for 2 minutes or longer in the cooling step of cooling the glass member makes it possible to suppress peeling off of the Au—Sn layer.

INDUSTRIAL APPLICABILITY

As described above, according to the method for manufacturing the package lid member and the method for manufacturing the package of the present invention, it is possible to suppress peeling off of the Au—Sn layer as the bonding layer and damage to the glass member, thus, it is possible to use the present invention in industry.

REFERENCE SIGNS LIST

1, 201 Package
2, 202 Package substrate
3, 3A-3D, 103, 203 Package lid member
4, 11, 204 Metalized layer
5, 5A-5D, 7D, 12, 105, 205 Au—Sn layer
6, 206 Bonding layer
21, 221 Recess
22 Bonding surface 10, 30, 130, 230 Glass member
31 Upper surface
32 Lower surface
33 Bonding portion
34 Light transmitting portion

What is claimed is:

1. A method for manufacturing a package lid member, the method comprising:
   a metalizing step of forming a metalized layer at a bonding portion provided on a surface of a glass member;
   a paste applying step of applying an Au—Sn paste on the metalized layer;
   a reflow step of heating and reflowing the Au—Sn paste after the paste applying step; and
   a cooling step of cooling the reflowed Au—Sn paste,
   wherein the cooling step includes a holding step of holding the reflowed Au—Sn paste in a holding temperature range of 150° C. or higher and 190° C. or lower for a holding time of 2 minutes or longer, and
   an Au—Sn layer formed of an Au—Sn alloy obtained by melting and solidifying the Au—Sn paste is formed at the bonding portion of the glass member.

2. The method for manufacturing a package lid member according to claim 1,
   wherein the holding temperature in the holding step is 160° C. or higher and 180° C. or lower.

3. The method for manufacturing a package lid member according to claim 1,
   wherein the holding time in the holding step is 3 minutes or longer and 8 minutes or shorter.

4. The method for manufacturing a package lid member according to claim 1,
   wherein the metalized layer is formed in a plurality of frame shapes on the glass member in the metalizing step and the Au—Sn paste is applied onto each of the plurality of metalized layers in the paste applying step, and
   a dividing step of obtaining a plurality of package lid members by dividing the glass member, in which the Au—Sn layer is formed in a plurality of frame shapes, into each Au—Sn layer is performed after the cooling step.

5. The method for manufacturing a package lid member according to claim 1,
   wherein a heating temperature in the reflow step is 280° C. to 350° C., and a heating time at 280° C. to 350° C. is 10 seconds to 120 seconds.

6. The method for manufacturing a package lid member according to claim 5,
   wherein the heating temperature in the reflow step is 330° C. or lower.

7. The method for manufacturing a package lid member according to claim 5,
   wherein the heating temperature in the reflow step is 300° C. or lower.

8. The method for manufacturing a package lid member according to claim 5,
   wherein the heating time in the reflow step is 20 to 90 seconds.

9. The method for manufacturing a package lid member according to claim 5,
   wherein the heating time in the reflow step is 30 to 60 seconds.

10. A method for manufacturing a package by bonding a package lid member obtained by the manufacturing method according to claim 1 and a package substrate, the method comprising:
    an arranging step of arranging the package lid member and the package substrate such that the Au—Sn layer is in contact with the package substrate;
    a heating step of heating the package substrate and the package lid member to melt the Au—Sn layer; and
    a cooling step of cooling the melted Au—Sn layer to form a bonding layer for bonding the package substrate and the package lid member,
    wherein the cooling step includes a holding step of holding the melted Au—Sn layer in a temperature range of 150° C. or higher and 190° C. or lower for a holding time of 2 minutes or longer.

11. The method for manufacturing a package according to claim 10,
    wherein a heating temperature and a heating time in the heating step are equal to the heating temperature and the heating time in the reflow step of the method for manufacturing a package lid member.

* * * * *